United States Patent [19]

Kiji et al.

[11] Patent Number: 4,721,871
[45] Date of Patent: Jan. 26, 1988

[54] HIGH VOLTAGE MOS SWITCH CIRCUIT WITH ISOLATION

[75] Inventors: Akio Kiji; Kazuo Aoki; Seiichirou Asari, all of Itami, Japan

[73] Assignee: Mitsubishi Denki Kabushiki Kaisha, Japan

[21] Appl. No.: 917,222

[22] Filed: Oct. 9, 1986

[30] Foreign Application Priority Data

Oct. 11, 1985 [JP] Japan .................. 60-227561

[51] Int. Cl.⁴ .......................... H03K 17/687
[52] U.S. Cl. ..................... 307/571; 307/572
[58] Field of Search ............... 307/578, 482, 571-574; 330/156

[56] References Cited

U.S. PATENT DOCUMENTS 4,494,015 1/1985 Frieling et al. .............. 307/482
4,570,085 2/1986 Redfield .................. 307/578

FOREIGN PATENT DOCUMENTS 482012 11/1975 U.S.S.R. ................. 307/482

OTHER PUBLICATIONS

"Session XIII. Nonvolatile Memory", Donaldson et al., 1983 IEEE International Solid-State Circuits Conference, pp. 168-169.
1983 IEEE International Solid-State Circuits Conference.

Primary Examiner—Stanley D. Miller
Assistant Examiner—B. P. Davis
Attorney, Agent, or Firm—Leydig, Voit & Mayer

[57] ABSTRACT

A high voltage switch circuit, wherein the source of a first MOS transistor is connected to the gate of a second MOS transistor, the source of the second MOS transistor is connected to the gate of the first MOS transistor, the drain of a third MOS transistor and the gate of a fourth MOS transistor, the drains of the first and fourth MOS transistors are connected to a high voltage input terminal, the sources of the third and fourth MOS transistors are connected to an output terminal, a voltage for turning the transistor ON is applied to the gate of the third MOS transistor, one electrodes of two independent capacitors are connected to the gates of the first and second MOS transistors, and a clock is applied through transmission gates to the other electrode of the two capacitors.

3 Claims, 2 Drawing Figures

HIGH VOLTAGE MOS SWITCH CIRCUIT WITH ISOLATION

BACKGROUND OF THE INVENTION

The present invention relates to a high voltage switch circuit for selectively applying a high voltage to a nonvolatile memory.

FIG. 1 illustrates a prior-art high voltage switch circit. In the drawing, reference numeral 1 denotes a high voltage input terminal, numeral 2 denote an output terminal, numerals 3 and 4 denote clock input terminals, numerals 5, 6, 7, 8, 9 and 10 denote MOS transistors, and numerals 11 and 12 denotes capacitors.

The source of the first MOS transistor 5 is connected to the drain and the gate of the second MOS transistor 6, the source of the second MOS transistor 6 is connected to the gate of the first MOS transistor 5, the drain of the third MOS transistor 8 and the gate of the fourth MOS transistor 7, the input terminal 1 is connected to the drains of the first and fourth MOS transistors 5 and 7, and the output terminal 2 is connected to the sources of the third and fourth MOS transistors 8 and 7.

Numerals 9 and 10 denote MOS transistors. These transistors 9 and 10 are connected in series between a power source VDD and a ground GND, the connecting point of both the transistors is connected to the output terminal, and are turned ON or OFF by a control circuit for selectively applying a high voltage to a predetermined nonvolatile memory cell. The power source VDD voltage is applied to the gate of the MOS transistor 8, and the capacitors 11 and 12 are respectively provided between the clock input terminals 3, 4 and the gates of the MOS transistors 5, 6.

The operation of the prior-art high voltage switch circuit will be described here below. In case the transistor 9 is now ON and the transistor 10 is OFF, the gate voltage of the transistor 5 is VDD−VTH, and the source become VDD−2VTH. When a clock 4 goes from a low to high in this state, the drain voltage of the transistor 6 becomes high due to the capacitive coupling, with the result that the source voltage of the transistor 6 rises through the channel of the transistor 6. This operation is repeated, the gate voltage of the transistor 7 becomes higher than the voltage of the input terminal 1, and the voltage of the input terminal 1 is transmitted to the output terminal 2. In case the transistor 9 is OFF and the transistor 10 is ON, the gate of the transistor 6 becomes the GND voltage in OFF state, with the result that the voltage of the output terminal 2 remains GND.

Since the prior-art high voltage switch circuit is constructed as described above, in case the transistor 9 is OFF and the transistor 10 is ON, the switch circuit is in a nonactive stage, clock pulses are input from the clock input terminals 3, 4. Therefore, a low voltage is induced at the gate of the transistor 7 by the capacitive coupling, with the result that there arises a problem that the low voltage is transmitted from the input terminal 1 to the output terminal 2.

SUMMARY OF THE INVENTION

The present invention has the objective of overcoming the above-described drawbacks of the prior-art high voltage switch circuit and has for main object to provide a high voltage switch circuit for maintaining the voltage of the output terminal 2 at the GND when the transistor 9 is OFF and the transistor 10 is ON.

A high voltage switch circuit according to the present invention does not input a clock pulse directly to a capacitor as in the prior art, but is constructed to input a clock pulse through a transmission gate.

In the high voltage switch circuit of the present invention, in case the high voltage switch circuit is active, the transmission gate is turned ON, while in case the switch circuit is nonactive, the transmission gate is turned OFF. Therefore, the high voltage switch circuit can prevent the output terminal voltage from rising during the nonactive time.

BRIEF DESCRIPTION OF THE DRAWINGS

In the drawings, the same symbols indicate the same or corresponding parts.

DESCRIPTION OF THE PREFERRED EMBODIMENT

Now, an embodiment of the present invention will be described with reference to FIG. 2.

Figure 1:
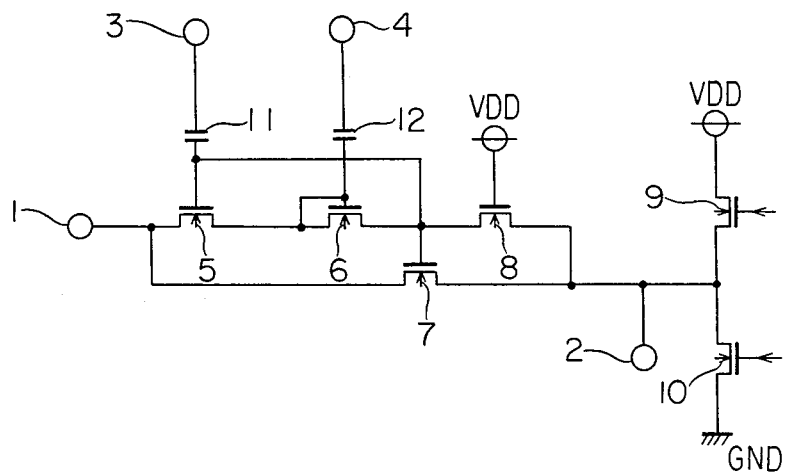
FIG. 1 is a circuit diagram showing a prior-art high voltage switch circuit.
Figure 2:
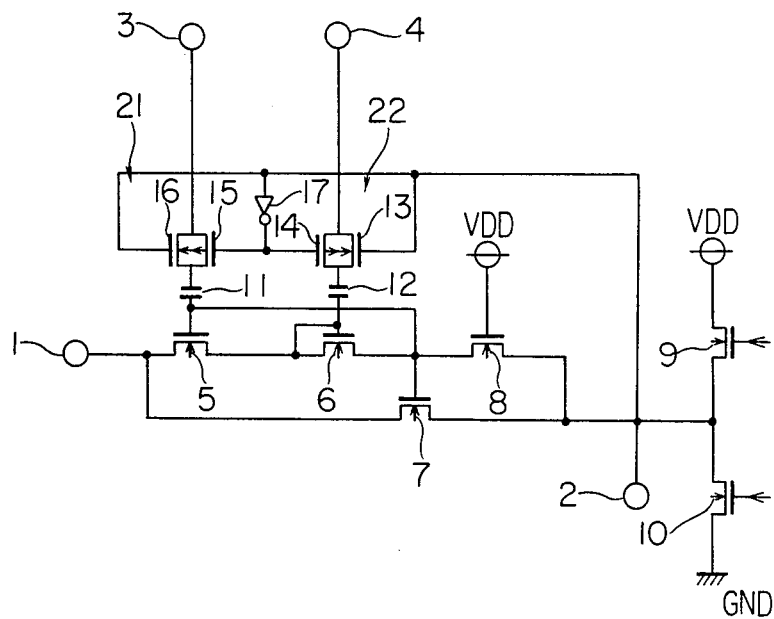
FIG. 2 is a circuit diagram showing an embodiment of a high voltage switch circuit according to the present invention.

FIG. 2 shows an embodiment of a high voltage switch circuit according to the present invention. In the drawing, reference numeral 1 denotes a high voltage input terminal, numeral 2 denotes an output terminal, numerals 3, 4 denote clock input terminals, numerals 5 to 10 denote MOS transistors, and numerals 11, 12 denote capacitors, which are connected similar to the prior art circuit in FIG. 1. In this embodiment, transmission gates 21 and 22 which respectively have MOS transistors 15, 16 and 13, 14 are provided between the clock input terminal 3 and the capacitor 11 and between the clock input terminal 4 and the capacitor 12, and the gates of the MOS transistors 14, 15 of the transmission gates 21 and 22 are connected through an inverter 17, and the gates of the MOS transistors 13, 16 are connected directly to the output terminal 2.

The operation of the high voltage switch circuit of the embodiment of the invention will be described here below.

In case the transistor 9 is ON and the transistor 10 is OFF, the transmission gates 21 and 22 are turned ON, a clock pulse is applied to the terminals of the capacitors 11 and 12, and operate similarly to the prior-art circuit. In case the transistor 9 is OFF and the transistor 10 is ON, the transmission gates 21 and 22 are turned OFF, no clock pulse is applied to the capacitors 11 and 12, with the result that the output terminal 2 remains GND.

According to the embodiment as described above, the transmission gates are provided between the clock input terminal and the capacitor, and are controlled by a signal line similarly to the control of the high voltage switch circuit. Therefore, the output terminal voltage of the nonactive state can be stably maintained at the GND level without considerably increasing the chip area.

In the embodiment described above, the transmission gates are controlled by the transistors 9 and 10. However, it is not intended to limit the present invention to only this, and it may be controlled by other control signals.

According to the high voltage switch circuit in accordance with the present invention as described above, the transmission gates are provided between the clock input and the capacitor. Therefore, the output terminal voltage in the nonactive state of the high voltage switch circuit can be maintained at the GND level.

What is claimed is:

1. A high voltage switch circuit having a plurality of MOS transistors each having a source, a gate and a drain, wherein the source of a first MOS transistor is connected to the gate of a second MOS transistor, the source of the second MOS transistor is connected to the gate of the first MOS transistor, the drain of a third MOS transistor and the gate of a fourth MOS transistor, the drains of the first and fourth MOS transistors are connected to a high voltage input terminal, the sources of the third and fourth MOS transistors are connected to an output terminal, a voltage for turning the third MOS transistor ON is applied to the gate of the third MOS transistor, a first of two electrodes of two independent capacitors are connected to the gates of the first and second MOS transistors, and a clock is applied through transmission gates to the second electrodes of said two capacitors, the transmission gates being selectively enabled or disabled by active or nonactive states of the high voltage switch circuit, respectively.

2. A high voltage switch circuit as set forth in claim 1, wherein a control voltage for setting the high voltage switch circuit to an active or nonactive state is applied to the output terminal.

3. A high voltage switch circuit as set forth in claim 2, wherein said transmission gate is turned ON when the high voltage switch circuit becomes an active state by the control signal and turned OFF when it becomes a nonactive state.

* * * * *